United States Patent
Lyne

(10) Patent No.: US 7,449,364 B2
(45) Date of Patent: Nov. 11, 2008

(54) DEVICE AND METHOD FOR INCLUDING PASSIVE COMPONENTS IN A CHIP SCALE PACKAGE

(75) Inventor: Kevin P. Lyne, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 178 days.

(21) Appl. No.: 11/460,859

(22) Filed: Jul. 28, 2006

(65) Prior Publication Data

US 2006/0263939 A1    Nov. 23, 2006

Related U.S. Application Data

(62) Division of application No. 10/103,386, filed on Mar. 21, 2002, now Pat. No. 7,105,923.

(60) Provisional application No. 60/344,200, filed on Dec. 28, 2001.

(51) Int. Cl.
*H01L 21/50* (2006.01)
*H01L 21/48* (2006.01)
*H01L 21/44* (2006.01)
*H01L 23/52* (2006.01)
*H01L 23/48* (2006.01)
*H01L 23/40* (2006.01)

(52) U.S. Cl. .............. 438/106; 438/108; 438/612; 438/613; 257/778; 257/779; 257/780; 257/738

(58) Field of Classification Search ................ 438/106, 438/108, 612, 613; 257/778–780, 738
See application file for complete search history.

(56) References Cited

U.S. PATENT DOCUMENTS

| 5,956,576 | A | * | 9/1999 | Toy et al. | ............... | 438/125 |
| 6,636,416 | B2 | * | 10/2003 | Li et al. | ............... | 361/306.1 |
| 6,657,133 | B1 | * | 12/2003 | Chee | ............... | 174/260 |

* cited by examiner

*Primary Examiner*—Luan Thai
(74) *Attorney, Agent, or Firm*—Wade James Brady, III; Frederick J. Telecky, Jr.

(57) ABSTRACT

The invention provides a method and device for building one or more passive components into a chip scale package. The method includes the steps of selecting a passive component having a terminal pitch that is a multiple of the package ball pitch of a chip scale package and mounting the selected passive component terminals to ball sites of the package. A preferred embodiment of the invention uses a single metal layer polyamide tape as the substrate of the package. Additional preferred embodiments of the invention are disclosed in which the terminal pitch multiple of the package ball pitch is one or two. Devices corresponding to the disclosed methods are also disclosed.

7 Claims, 1 Drawing Sheet

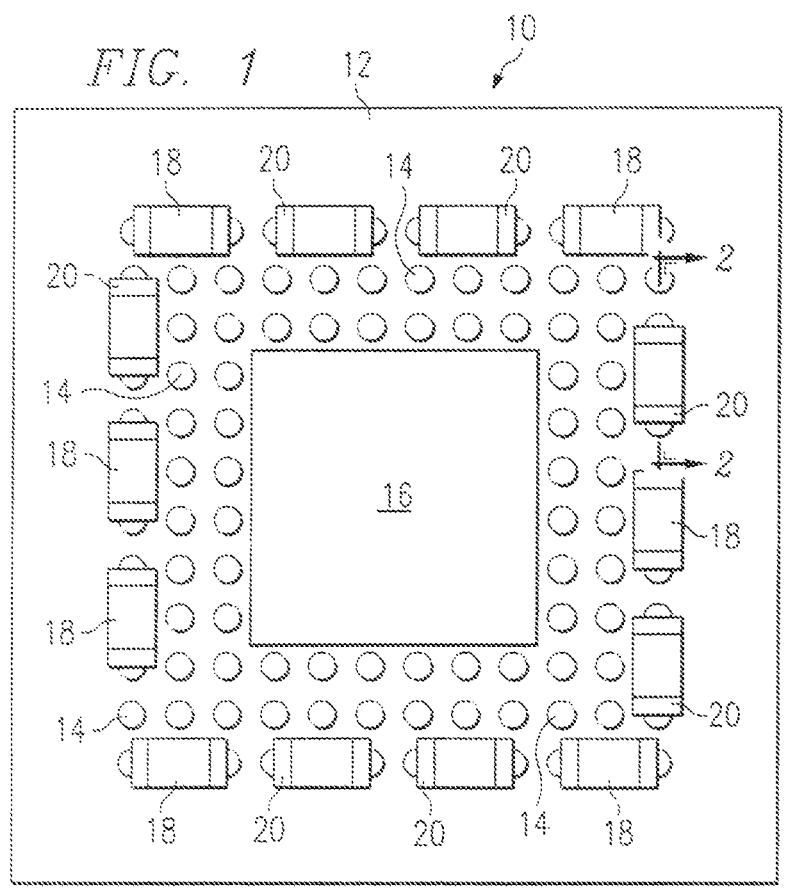
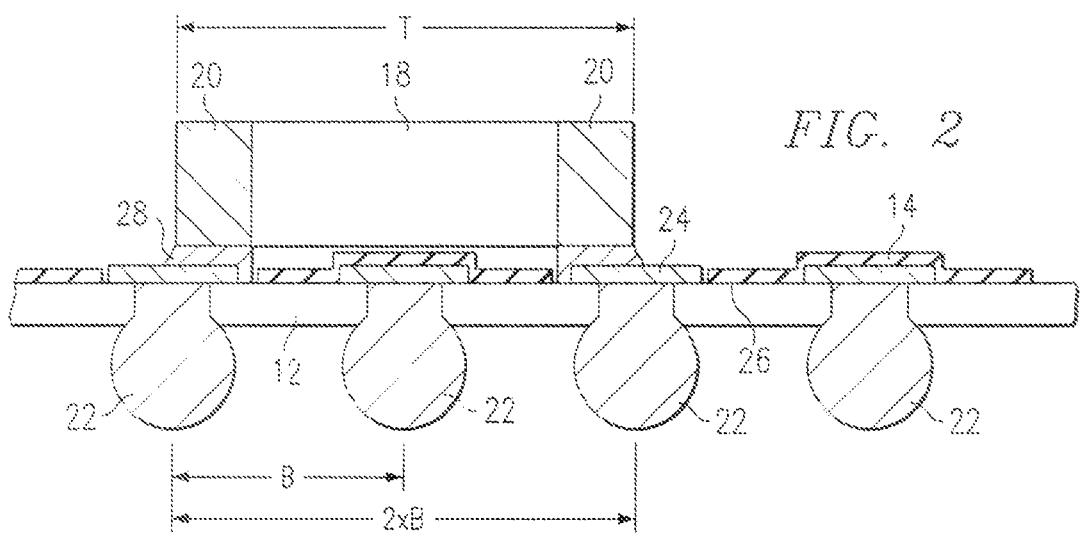

DEVICE AND METHOD FOR INCLUDING PASSIVE COMPONENTS IN A CHIP SCALE PACKAGE

PRIORITY DATE

This is a divisional application of application Ser. No. 10/103,386 filed Mar. 21, 2002, now U.S. Pat. No. 7,105,923 the contents of which are herein incorporated by reference in its entirety, which claims the benefit of U.S. Provisional Application No. 60/344,200, filed Dec. 28, 2001.

TECHNICAL FIELD

The invention relates to devices and methods for packaging integrated circuit (IC) devices. More particularly, the invention relates to the packaging of ICs with accompanying discrete passive components on the same chip package by forming direct connections between substrate solder balls and IC and discrete component terminals or pads.

BACKGROUND OF THE INVENTION

In use, integrated circuits (ICs) generally require electrical connections to a substrate to form a package providing electrical connections to additional electronic devices. In general, in a ball grid array (BGA), an approximately square package substrate is provided with solder balls for electrical connection to IC terminals or bonding pads. The package substrate may be composed of multiple layers of semiconductor, mask, and conductive materials depending upon the complexity of the electrical connections to be made. In practice, the more layers, the higher the manufacturing effort and expense.

IC dice may be packaged alone, but frequently an IC die is included on a package substrate along with one or more discrete passive components such as resistors, capacitors, and so forth. Including discrete passive components in an IC package typically adds significant development and manufacturing costs and design complexity to the packaging endeavor. This complexity is engendered by the need for engineering changes to the package to accommodate the interconnection of the components selected for a particular application. Generally, expenses and complexity are also increased by the necessity of using multiple layer substrates in order to make electrical connections among the various discrete component terminals, IC terminals, and ball sites of the substrate.

Methods and devices providing the capability of including discrete passive components in an IC chip scale package with reduced cost and a reduced need for engineering changes to the package would be desirable in the arts.

SUMMARY OF THE INVENTION

In general, devices and methods providing for the inclusion of electrically connected discrete components and ICs in a single chip package with reduced complexity and expense are disclosed.

According to one aspect of the invention, a method of building one or more passive components into an existing chip scale package includes the steps of selecting a passive component having a terminal pitch that is a multiple of the package ball pitch of a chip scale package and mounting the passive component terminals or pads directly to ball sites of the package.

According to another aspect of the invention, a single metal layer polyamide tape is selected for use as the substrate of the package.

According to still another aspect of the invention, a chip scale package device has at least one IC and at least one discrete passive component connected to a package having a preselected ball pitch. The IC terminals or pads, as well as those of the discrete passive component, are coupled directly to ball sites of the package. In order to facilitate direct coupling, the discrete passive component has a terminal pitch that is a multiple of the package ball pitch.

Technical advantages are provided by the invention, including but not limited to reduced design complexity when engineering a package for selected ICs and discrete passive components. Reduced expense through the use of single metal layer substrate and the avoidance of multiple metal layer substrate. Reduced design and test times due to the ready connectablitity of components facilitated by the invention. These and many other advantages related to the improvements of the invention will become apparent to persons skilled in the relevant arts through careful reading of the disclosure and claims presented herein.

BRIEF DESCRIPTION OF THE DRAWINGS

For a better understanding of the invention including its features, advantages and specific embodiments, reference is made to the following detailed description along with accompanying drawings in which:

FIG. 1 depicts a top view of a package showing an example of the invention; and

FIG. 2 shows a cross-sectional view of a portion of FIG. 1 taken along line 2-2 of FIG. 1.

References in the detailed description correspond to like references in the figures unless otherwise noted. Like numerals refer to like parts throughout the various figures. The descriptive and directional terms used in the written description such as top, bottom, left, right, etc., refer to the drawings themselves as laid out on the paper and not to physical limitations of the invention unless specifically noted. The drawings are not to scale and some features of embodiments shown and discussed are simplified or exaggerated for illustrating the principles of the invention.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts. It should be understood that the invention may be practiced with dice and discrete devices of various types and materials without altering the principles of the invention.

A preferred embodiment of the invention is shown in the example of FIG. 1. A package 10 is based on a substrate 12, preferably a single metal layer tape substrate although double layer or other multi-layer substrates may also be used. The substrate 12 contains ball sites 14 arranged in a grid pattern and having standardized spacing. For example spacing, commonly referred to as "ball pitch", of 0.50 millimeters, or 0.80 millimeters is known in the arts. Of course, many alternative pitches are possible. A semiconductor die, typically an IC 16, is mounted on a substrate 12 by connecting die terminals or pads (not shown in FIG. 1) to ball sites 14. Discrete passive components 18, such as resistors, capacitors, etc., are included on the substrate 12 as well. In the preferred embodiments of the invention, the discrete component 18 terminals 20 are connected directly to ball sites 14 of the substrate 12.

Thus the package 10 is completed without the need for additional electrical connections or leads on the substrate 12, avoiding the need in many cases for multilayer substrates. This direct package connection is achieved by the selection of a ball pitch for the package chosen to match the terminal pitch of the discrete component as further described with reference to FIG. 2 below.

FIG. 2 is a cross-section view taken along line 2-2 of FIG. 1. The single metal layer tape substrate 12 is shown with a discrete component 18 mounted thereon. The ball sites 14 are evenly spaced having a predetermined ball pitch B. The discrete component 18 has a predetermined terminal pitch indicated by T. According to the preferred embodiment of the invention, the substrate 12 ball pitch B is fabricated to match the terminal pitch T by some whole number multiple. For example, as shown in FIG. 2, the terminal pitch T is equal to two times the ball pitch B or, T=2×B. Typically, the discrete component 18 is joined to the substrate 12 by means of a conductive adhesive 28 to the via cap 24 of the ball site 14 at preselected locations where the solder mask 26 of the substrate 12 has been removed.

In the preferred embodiment of the invention represented in FIG. 2, the discrete component 18 is a "0402" component having a terminal pitch T of 1.0 millimeters and the ball pitch B of the substrate 12 has been chosen as 0.50 millimeters. This way, there is a direct correspondence between component terminals 20 and selected ball sites 14, facilitating the direct electrical connection of the discrete component 18 to the substrate 12 with minimal time and expense, advantageously avoiding the time and expense otherwise associated with the design and manufacture of horizontal and multilayer connections. Of course, the values shown and described with reference to FIG. 2 are merely examples and are not intended to limit the practice of the invention to any particular numerical values. To cite but a few additional examples, "0603" discrete passive components may also be used, as may a substrate having a ball pitch of 1.0 millimeter.

The embodiments shown and described above are only exemplary. Even though numerous characteristics and advantages of the present invention have been set forth in the foregoing description together with details of the method and device of the invention, the disclosure is illustrative only and changes may be made within the principles of the invention to the full extent indicated by the broad general meaning of the terms used in the attached claims.

I claim:

1. A method of building one or more passive components into an existing chip scale package comprising the steps of:
   providing a substrate having a plurality of ball sites on one surface thereof, the ball sites having a preselected pitch;
   providing an integrated circuit having terminals which are coupled directly to ball sites of the substrate;
   providing a passive component having a pair of fixed pitch position terminals thereon, said terminals having a terminal pitch that is substantially an integral multiple of the pitch of the ball sites; and
   mounting the passive component terminals directly to ball sites of the package.

2. The method of claim 1 further comprising the step of selecting a passive component wherein the terminal pitch multiple of the package ball pitch is one.

3. The method of claim 1 further comprising the step of selecting a passive component wherein the terminal pitch multiple of the package ball pitch is two.

4. The method of claim 1 further comprising the step of selecting a package having a ball pitch of 0.50 millimeters.

5. The method of claim 1 further comprising the step of selecting a package having a ball pitch of 1.0 millimeters.

6. The method of claim 1 further comprising the step of using a single conductive layer tape as the substrate of the package.

7. The method of claim 1 further comprising the step of using a single metal layer polyimide tape as the substrate of the package.

* * * * *